United States Patent
Clouqueur et al.

(10) Patent No.: US 10,310,015 B2
(45) Date of Patent: Jun. 4, 2019

(54) METHOD AND APPARATUS FOR PROVIDING CLOCK SIGNALS FOR A SCAN CHAIN

(71) Applicant: Advanced Micro Devices, Inc., Sunnyvale, CA (US)

(72) Inventors: Thomas A. Clouqueur, Arlington, MA (US); Dwight K. Elvey, Santa Cruz, CA (US); Kamran Zarrineh, Topsfield, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 1037 days.

(21) Appl. No.: 13/946,083

(22) Filed: Jul. 19, 2013

(65) Prior Publication Data

US 2015/0026532 A1 Jan. 22, 2015

(51) Int. Cl.
*G01R 31/28* (2006.01)
*G01R 31/3185* (2006.01)

(52) U.S. Cl.
CPC ........... *G01R 31/318552* (2013.01); *G01R 31/318541* (2013.01)

(58) Field of Classification Search
CPC .............. G01R 31/28; G01R 31/3177; G01R 31/3185; G01R 31/318525; G01R 31/318536; G01R 31/318541; G01R 31/318544; G01R 31/318552; G01R 31/318555; G01R 31/318572; G01R 35/00; G06F 11/25; H05K 999/99
See application file for complete search history.

(56) References Cited

U.S. PATENT DOCUMENTS

| | | | | |
|---|---|---|---|---|
| 5,371,417 A | * | 12/1994 | Mirov | G06F 1/06 327/115 |
| 5,463,338 A | * | 10/1995 | Yurash | H03K 3/0375 327/144 |
| 5,689,517 A | * | 11/1997 | Ruparel | G01R 31/318541 307/418 |
| 5,920,575 A | * | 7/1999 | Gregor | G01R 31/318541 714/726 |
| 6,060,924 A | * | 5/2000 | Sugano | G01R 31/318586 327/141 |
| 6,611,933 B1 | * | 8/2003 | Koenemann | G01R 31/318547 714/726 |
| 7,843,218 B1 | * | 11/2010 | Ramaraju | G01B 31/318541 326/38 |
| 2003/0204802 A1 | * | 10/2003 | Sim | G01R 31/2891 714/726 |
| 2004/0148554 A1 | * | 7/2004 | Dervisoglu | G01R 31/318335 714/727 |

(Continued)

*Primary Examiner* — Albert Decady
*Assistant Examiner* — Enamul M Kabir

(57) ABSTRACT

An integrated circuit device includes a plurality of flip flops configured into a scan chain. The plurality of flip flops includes at least flip flop of a first type and at least one flip flop of a second type. A method includes generating a first scan clock signal for loading scan data into at least one flip flop of a first type, generating a second scan clock signal and a third scan clock signal for loading the scan data into at least one flip flop of a second type, and loading a test pattern into a scan chain defined by the at least flip flop of the first type and the at least one flip flop of the second type responsive to the first, second, and third scan clock signals.

22 Claims, 5 Drawing Sheets

(56) References Cited

U.S. PATENT DOCUMENTS

| | | | |
|---|---|---|---|
| 2004/0153926 A1* | 8/2004 | Abdel-Hafez | ............................... G01R 31/318385 714/726 |
| 2006/0095819 A1* | 5/2006 | Bhatia | ............ G01R 31/318541 714/726 |
| 2009/0113263 A1* | 4/2009 | Cannon | .......... G01B 31/318536 714/726 |
| 2010/0169728 A1* | 7/2010 | Dehnert | ......... G01B 31/318555 714/731 |
| 2010/0332924 A1* | 12/2010 | Ziaja | .............. G01B 31/318541 714/718 |
| 2011/0161759 A1* | 6/2011 | Jaber | .............. G01B 31/318541 714/731 |
| 2012/0054568 A1* | 3/2012 | Kuo | ............... G01B 31/318544 714/731 |
| 2013/0111285 A1* | 5/2013 | Chakravarty | .. G01R 31/318541 714/726 |
| 2014/0289578 A1* | 9/2014 | Sugiyama | ...... G01R 31/318533 714/727 |

* cited by examiner

METHOD AND APPARATUS FOR PROVIDING CLOCK SIGNALS FOR A SCAN CHAIN

BACKGROUND

Field of the Disclosure

The present disclosure generally relates to integrated circuit device testing and, more particularly, providing clock signals for a scan chain.

Description of the Related Art

Scan testing is frequently used for characterizing integrated circuit devices. In a scan topology, the flip flops of a logic unit are placed into a serial chain using alternate test mode routing circuitry, resulting in a circuit resembling a serial shift register with as many stages as the number of flip flops. Test patterns are shifted into the flip flops to test the logic circuitry of the device. After a test pattern is loaded into the flip flops, the response of the logic circuitry is captured in one or more of the flip flops using one or more scan clock capture pulses. After the results are captured, a new test pattern may be loaded into the flip flops for another test iteration while shifting out responses for the previous test pattern. Different test patterns may be used to test different functionalities of the device, to collect timing information, and to identify faults.

The flip flops receive a system clock signal for normal operation and a scan clock signal for scan shifting. There are two conventional styles of flip-flops that may be configured into scan chains. Multiplexer-data (MuxD) flip-flops have a single clock port and include a multiplexer for selecting between the scan data and the functional data. Level-sensitive scan design (LSSD) flip-flops have separate scan data and functional data input ports and use a dedicated pair of non-overlapping scan clocks to shift the scan data. Each type of flip flop has different applications. As used herein the term "non-overlapping" refers to the scan clock signals not being asserted at the same time. Typically, high-performance circuits often use LSSD flip flops, while MuxD flops are used for standard circuits. LSSD flip flops have a performance advantage in meeting setup timing requirements, since there is no multiplexing logic on the functional input path. LDDS flip flops are also resistant to hold timing violations on the scan path, because violations can be worked around by slowing down the non-overlapping clocks. MuxD flip flops, on the other hand, must be hold-violation free to ensure that they can be shifted properly, which is usually achieved by conservatively buffering the scan paths, thus impacting shift speed. Because of the different clocking schemes, conventional integrated circuit devices employ a single type of flip flop for an entire clock domain, either MuxD or LSSD.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF EMBODIMENT(S)

FIGS. 1-5 illustrate example techniques for the generation of scan clock signals for flip flops having different timing schemes so as to allow the flip flops to be integrated into a common scan chain. In a scan chain, the operation wiring between devices is bypassed, and the flip flops are connected into a serial chain. Test patterns may be loaded into the scan chain to test the operability of the devices and logic connected to the devices. Scan chains including both MuxD and LSSD flip flops may be constructed and aligned scan clock signals may be provided to the MuxD and LSSD flip flops to allow shifting of scan data from a MuxD flip flop to an LSSD flip flop or vice versa. In an external scan clock mode, the scan clock signals may be generated by an automated tester, while in an internal scan clock mode, an internal scan control unit may generate the scan clock signals. In the external scan clock mode, a clock distribution network for distributing a functional clock signal for the devices may be shared during the scan to send one of the external scan clock signals, simplifying wire routing. In both internal and external scan modes, a common signal may be used to generate one of the scan clock signals for the LSSD flip flops and also to generate a scan clock signal for the MuxD flip flops to provide the timing alignment required for interfacing different types of devices.

Figure 1:
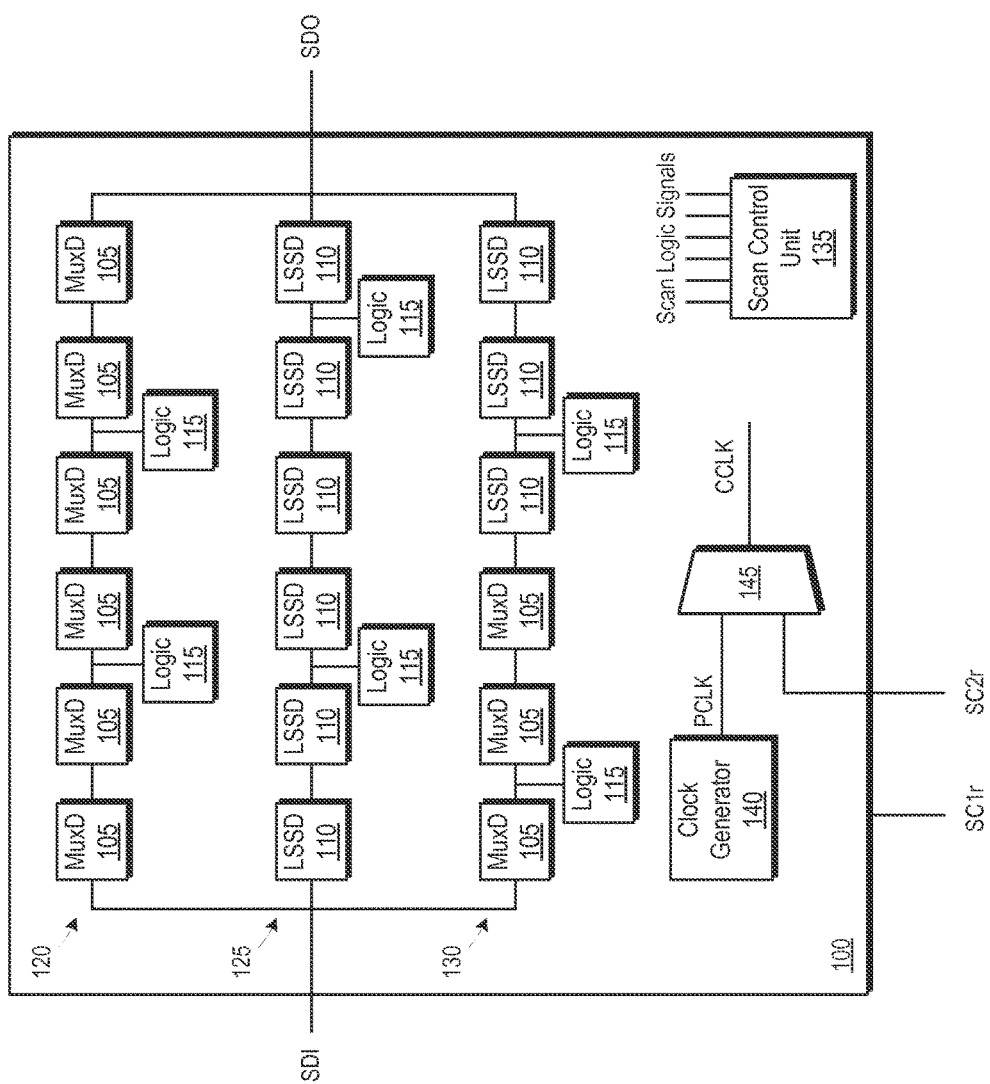
FIG. 1 is a block diagram of an integrated circuit device including MuxD and LSSD flip flops organized into scan chains in accordance with some embodiments.

FIG. 1 is a block diagram of an integrated circuit device 100 according to some embodiments. The integrated circuit device 100 includes a plurality of logic devices, including flip flops of a first type (illustrated as multiplexer-data ("MuxD") flip flops 105) and flip flops of a second type (illustrated as level-sensitive scan design ("LSSD") flip flops 110), referred to collectively as "flip flops 105, 110". The flip flops 105, 110 are generally used for moving data throughout the integrated circuit device 100 for processing by various logic circuitry 115. For testing purposes, the flip flops 105, 110 may be grouped into one or more scan chains, such as scan chains 120, 125, 130. In scan chains 120, 125, 130, the normal routing path for the flip flops 105, 110 is bypassed and the flip flops 105, 110 are serially connected, constructing a pseudo shift register. Test patterns may be shifted into the flip flops 105, 110 by an external tester (not shown) using an external scan data in (SDI) input terminal to test the logic circuitry 115 of the device. After a test pattern is loaded into the flip flops 105, 110, the response of the logic circuitry is captured in one or more of the flip flops 105, 110 and provided to the external tester via a scan data output signal (SDO) representing the results of the processing by the logic circuitry 115 responsive to the test pattern.

In the illustrated example, the scan chain 120 is composed of MuxD flip flops 105 only, the scan chain 125 is composed of LSSD flip flops 110 only, and the scan chain 130 is composed of a combination of MuxD flip flops 105 and LSSD flip flops 110. Although three scan chains 120, 125, 130 are illustrated, many more may be present depending on the particular design of the integrated circuit device 100, and the mix between MuxD flip flops 105 and LSSD flip flops 110 may also vary.

A scan control unit 135 selects one or more scan chains 120, 125, 130 for testing. After the results of the integrated circuit device 100 responsive to a test pattern are captured, a new test pattern may be loaded into the flip flops 105, 110 for another test iteration while shifting out responses for the previous test pattern. The scan control unit 135 generates various logic signals for controlling the scan testing, as will be described in greater detail herein. The scan control unit 135 may be configured to use internal or external scan clock signals for loading the test patterns and capturing the results. The internal scan clock signals are generated by the scan control unit 135 and the external scan clock signals (SC1$r$, SC2$r$) are provided by the external tester.

The SC1$r$ and SC2$r$ signals are distributed to the LSSD flip flops 110 for scan clocking. A clock generator 140 (e.g., a phase locked loop) generates an internal functional clock signal ("PCLK") for clocking the flip flops 105, 110 and logic circuitry 115 during normal operation. During the loading of a test pattern using scan clock signals, the functional clock, PCLK, is disabled. Hence, the clock distribution tree for the PCLK signal is not used, and it may be used to distribute one of the scan clock signals, such as the SC2$r$ signal. A multiplexer 145 may be configured by the scan control unit 135 to select between the PCLK signal or the SC2$r$ signal responsive to a scan shift external distribution signal ("SSED"). As described herein, the SC2$r$ signal is employed to generate a scan clock signal for both the MuxD flip flops 105, while the SC1$r$ signal is only used by the LSSD flip flops 110. Using the PCLK distribution tree avoids the need to provide separate circuitry for distributing the SC2$r$ signal to all of the flip flops 105, 110. Because the SC1$r$ signal is only used by the LSSD flip flops 110, its distribution network is smaller than that needed for the SC2$r$ signal.

Figure 2:
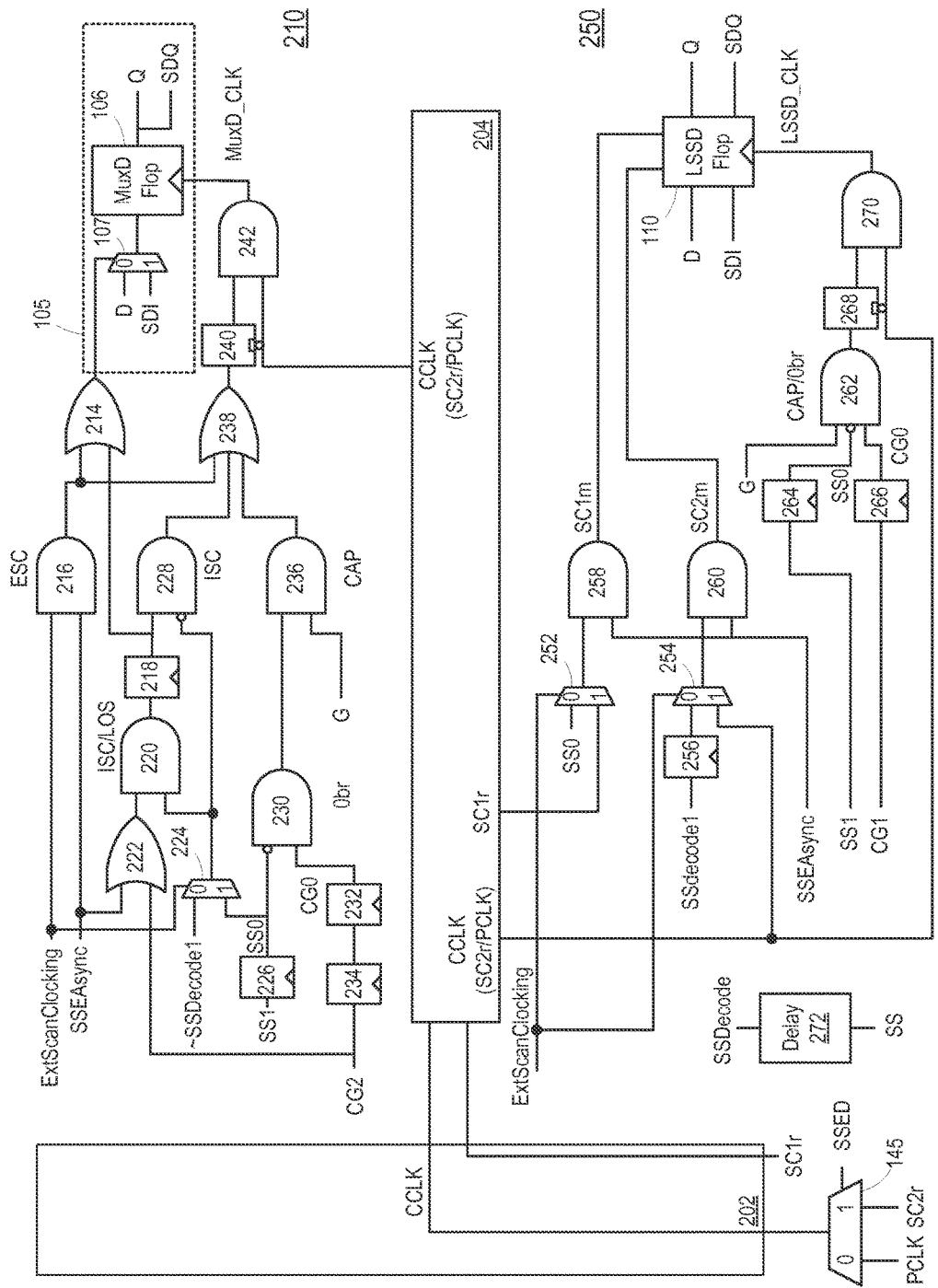
FIG. 2 is a circuit diagram illustrating clock signal distribution and generation for the flip flops of FIG. 1.

FIG. 2 is a circuit diagram illustrating scan clock logic for generating scan clock signals for MuxD and LSSD flip flops 105, 110 in the integrated circuit device 100 of FIG. 1, in accordance with some embodiments. The multiplexer 145 selects between the PCLK signal and the SC2$r$ signal, as described above in reference to FIG. 1. The common clock signal, "CCLK," is the signal output by the multiplexer 145 and distributed by a vertical clock distribution tree 202 to a horizontal clock distribution tree 204. The horizontal clock distribution tree 204 distributes the CCLK signal to MuxD flips flops 105, and the CCLK signal and the SC1$r$ signal to LSSD flip flops 110. The clock distribution trees 202, 204 are configured to provide an insertion delay for the SC1$r$ signal matching the insertion delay of the CCLK distribution network. MuxD scan clock logic 210 and LSSD scan clock logic 250 generate scan clock signals for the MuxD and LSSD flips flops 105, 110, respectively.

Various logic signals used by the scan clock logic 210, 250 are pipelined, meaning that they pass through one or more data flip flops that define a pipeline. The pipeline imposes a one clock cycle delay on the logic signal for each stage. The logic signal exiting the pipeline is denoted by a "0" suffix. The suffix is incremented based on the pipeline stage. As an example, for a generic logic signal (not shown in FIG. 2), "LS," "LS0" refers to the logic signal leaving the pipeline and "LS2" refers to the logic signal two pipeline stages removed from the exiting signal, "LS0." The "LS2" signal transitions two clock cycles before the "LS0" signal. A logic signal with a prefix of "~" indicates an inverted version of the logic signal.

The MuxD scan clock logic 210 may be replicated for different scan chains or for different sections of the integrated circuit device 100. The MuxD scan clock logic 210 includes an AND gate 242 coupled to the clock input of a latch portion 106 of an exemplary MuxD flip flop 105. The output of the AND gate 242 may be provided to a plurality of MuxD flip flops 105, such as all of the MuxD flip flops 105 in a particular scan chain. A multiplexer portion 107 of the MuxD flip flop 105 selects the data source for the flip flop 105, either the functional data input, "D", or the scan data input, "SDI." The control input of the multiplexer portion 107 is controlled by an OR gate 214. An AND gate 216 configured to receive an external scan clocking signal, "ExtScanClocking," and a scan shift enable asynchronous signal, "SSEAsync." The AND gate 216 is coupled to the input of the OR gate 214. The OR gate 214 also receives an input from a flip flop 218. The inputs of the AND gate 220 are coupled to an OR gate 222 and a multiplexer 224. The OR gate 222 is configured to receive the SSEAsync signal and a clock gater signal, "CG2." The multiplexer 224 is controlled by the ExtScanClocking signal to select between a scan shift decode signal, "~SSDecode1" and a scan shift signal, "SS0." A flip flop 226 pipelines the SS signal. The output of the flip flop 218 is coupled to an AND gate 228. The AND gate 228 has an inverted input that receives the output of the multiplexer 224. The SS0 signal is received by an AND gate 230, which inverts the SS0 signal. The AND gate 230 also receives an input from a clock gater signal, "CG0," pipelined by flip flops 232, 234. The output of the AND gate 230 and a fine clock gater signal, "G" are received by an AND gate 236. The outputs of the AND gates 216, 228, 236 are received by an OR gate 238. The OR gate 238 is coupled to a de-glitching latch 240. The de-glitching latch 240 is coupled to the horizontal clock distribution tree 204 to receive the CCLK signal and selectively pass the clock signal to its output when enabled by the OR gate 238. The output of the de-glitching latch 240 is provided along with the CCLK signal to an AND gate 242. The AND gate 242 generates a clock signal, "MuxD_CLK," for the latch portion 106 of the MuxD flip flop 105. The flip flops 218, 226, 232, 234 are clocked by the CCLK signal.

The LSSD scan clock logic 250 includes multiplexers 252, 254 for selecting between internal and external scan clock signals for the LSSD flip flop 110 or flip flops 110 based on the state of the ExtScanClocking signal. The logic 250 may be replicated for different scan chains or for different sections of the integrated circuit device 100. The multiplexer 252 selects between the SS0 signal and the SC1$r$ signals. The multiplexer 254 selects between the SSdecode0 signal pipelined by a flip flop 256 and the CCLK signal (which corresponds to the SC2$r$ signal during external scan clocking). The multiplexer 252 is coupled to an AND gate 258, and the multiplexer 254 is coupled to an AND gate 260. The AND gates 258, 260 also receive the SSEAsync signal as inputs. The AND gates 258, 260 generate scan clocking signals, "SC1$m$," "SC2$m$," for the LSSD flip flop 110. An AND gate 262 receives the fine clock gater signal, G, the SS0 signal, pipelined by a flip flop 264, and the CG0 signal, pipelined by a flip flop 266. The AND gate 262 inverts the value of the SS0 signal. The output of the AND gate 262 is coupled to a de-glitching latch 268. The de-glitching latch 268 is coupled to the horizontal clock distribution tree 204 to selectively pass the CCLK signal to its output when it is enabled by the AND gate 262. The output of the de-glitching latch 268 is provided along with the CCLK signal to an AND gate 270. The AND gate 270 generates a clock signal, "LSSD_CLK," for the LSSD flip flop 110. The flip flops 256, 264, 266 are clocked by the CCLK signal.

The general functions of the logic elements in the scan clock logic 210, 250 are described below using timing diagrams to illustrate the different modes of operation. The general modes include external scan clocking ("ESC"), where scan clock signals are provided by an external tester, and internal scan clocking ("ISC"), where scan clock signals are generated by the scan control unit 135 of FIG. 1. A capture mode ("CAP") is provided after a test pattern has been loaded to allow the response of the integrated circuit device 100 to the test pattern to be determined. The capture pulses record the results of the scan test so that they may be read on the SDO signal line by the tester. During the capture mode for the MuxD flip flops 105, an additional clock cycle may be provided prior to the capture pulse(s) to implement a mode referred to as "launch on shift" (LOS). Launch on shift is used to generate transitions out of the MuxD flip flops 105 for the purpose of testing logic downstream of those flip flops 105. Such transitions could also be created by setting a desired value on the functional D input of a flip flop 105, but it is easier for the automated tester to launch on shift by launching from the scan input which is directly connected to the previous scannable flip flop 105 in the scan chain. The integrated circuit device may include logic devices, such as B latches, that are not included in the scan chains 120, 125, 130, referred to as non-scannable elements (not shown). A "0br" mode is used to load the non-scannable elements (not shown) in the integrated circuit device 100. A 0br clock rises in the b phase of a cycle and is forced to pulse in the 0th cycle, which is the first cycle after a reset (0: 0th cycle, B: b-phase, R: rising).

In general, the OR gate 214 controls the data source for the MuxD flip flop 105, and the OR gate 238 enables the clock signal for the MuxD flip flop 105. In ESC mode, the clock signal is enabled by the AND gate 216 when ExtScanClocking and SSEAsync are asserted. In ISC and LOS modes, the clock signal is enabled by the AND gate 228 one cycle after the signal at the output of the multiplexer 224 (SS0 or ~SSDecode1) is asserted and one of CG1 or SSEAsync is asserted. In CAP mode, the clock signal is enabled by the AND gate 236 when the clock gater signals, CG0 and G, are asserted and the scan shift signal, SS0 is de-asserted. The multiplexer portion 107 of the MuxD flip flop 105 is placed in scan mode by the AND gate 216 when ExtScanClocking and SSEAsync are asserted in ESC mode or by the AND gate 228 one cycle after the signal at the output of the multiplexer 224 is asserted and one of SSEAsync or CG2 is asserted in ISC mode. In CAP mode, the AND gate 262 enables the clock signal for the LSSD flip flop 110 when the clock gater signals, CG0 and G, are asserted and the scan shift signal, SS0, is de-asserted. The AND gates 228 and 262 also prevent updating of the flips flops 105, 110 during 0br mode, when the non-scannable elements are updated.

In some embodiments, the scan control unit 135 may generate both SS and SSDecode and distribute them to the scan clock control logic 210, 250. In some embodiments, the SSDecode signal may be generated from the SS signal, as opposed to being generated independently. For LSSD flip flops 110, the scan clock signals must be non-overlapping, and the timing may be adjusted to tune the performance of the devices. The scan control unit 135 may generate the SS signal and distribute it to the instances of the scan clock control logic 210, 250 in the integrated circuit device 100. An optional local delay network 272 (see FIG. 2) may be used to provide an adjustable the delay between the SS and the SSDecode signals.

For purposes of the following examples, it is assumed that the fine clock gater signal, G, remains asserted during the time periods shown. In general, the fine clock gater is used for power saving during functional operation of the circuit, which is outside the scope of the present application. During a scan test, its value may be changed depending on the test pattern to test the proper behavior of the fine clock gater. However, for the following illustrations, the functionality of the fine clock gater is not being tested.

Figure 3:
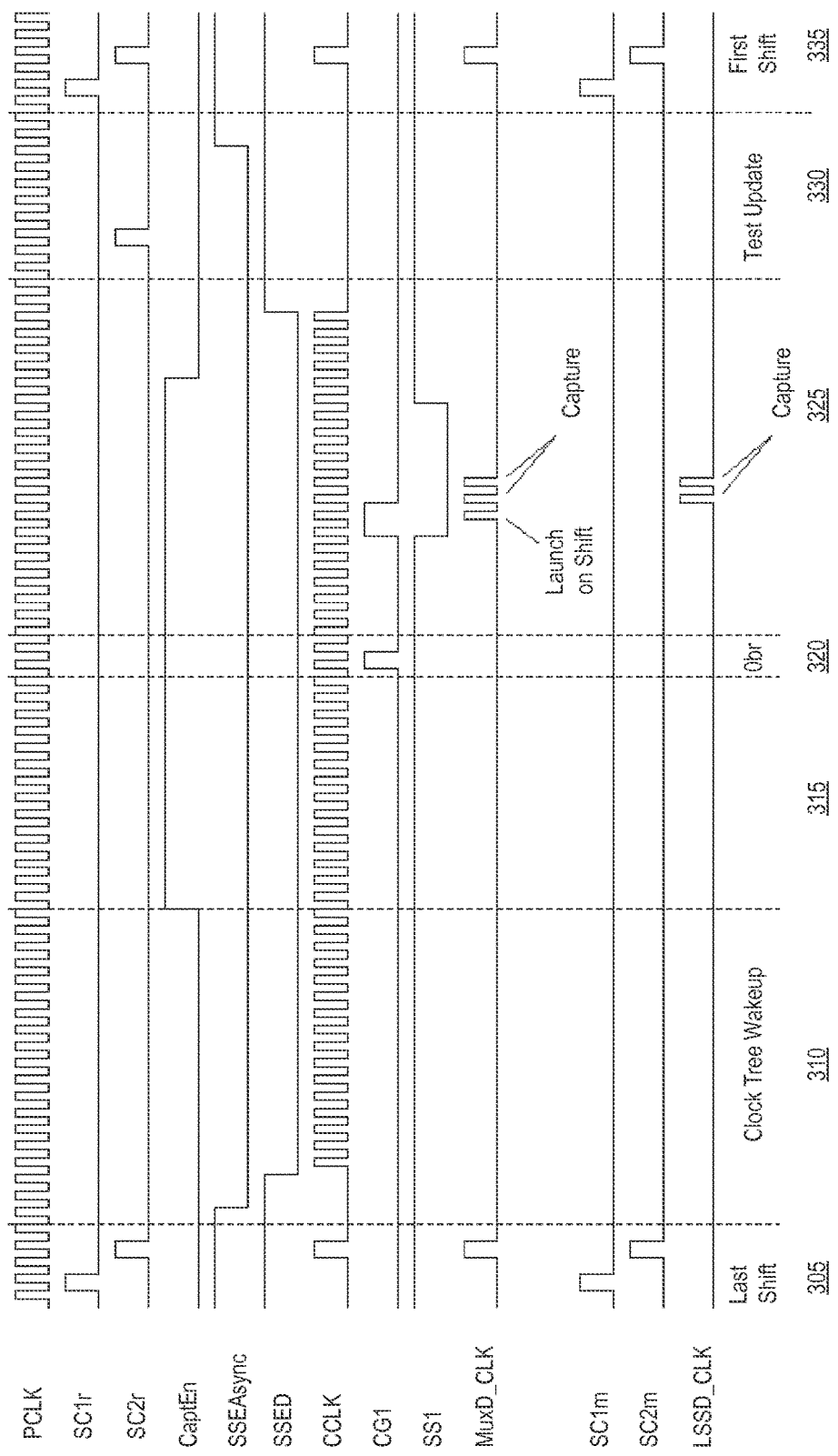
FIG. 3 is a timing diagram illustrating the operation of the circuit of FIG. 1 during an external scan clocking mode.

FIG. 3 is a timing diagram 300 illustrating the logic signals generated by the scan control unit 135 for external scan clocking in accordance with some embodiments. The operation of the scan clock logic 210, 250 in external scan clocking mode is described in reference to FIGS. 2 and 3. External scan clocking mode (ESC) is controlled by asserting the ExtScanClocking signal. The SSED signal is also asserted to route the SC2r signal through the CCLK distribution network via the multiplexer 145.

Region 305 represents the last shift of a scan shift period where a test pattern is loaded into a scan chain. ExtScanClocking and SSEAsync are asserted. Because ExtScanClocking and SSEAsync are asserted, the OR gate 214 places the multiplexer portion 107 of the MuxD flip flop 105 in scan mode. The clock signal, MuxD_CLK is also enabled by the OR gate 238 because ExtScanClocking and SSEAsync are asserted and generate an enable signal at the AND gate 216. Thus, the MuxD_CLK signal tracks the SC2r signal as controlled by the de-glitching latch 240.

In the LSSD scan clock logic 250, the ExtScanClocking signal configures the multiplexers 252, 254 to select the SC1r, and SC2r signals, respectively. Because SSEAsync is also asserted, the AND gates 258, 260 enable the SC1m and SC2m scan clock signals to track the SC1r, and SC2r signals. The output of the AND gate 262 is de-asserted because SS0 is asserted. The LSSD_CLK signal is not used to load the scan data, as loading is controlled by the SC1m and SC2m signals.

Region 310 is a clock tree wakeup region that allows the CCLK network to stabilize from a switch between the SC2r clock and the PCLK. The SSEAsync and SSED signals are de-asserted. With SSED removed, the PCLK signal appears on the CCLK network as controlled by the multiplexer 145.

In Region 315, a capture enable signal, "CaptEn," is asserted to enable the output circuitry for capturing the result. In region 320, a "0br" cycle is used to load non-scannable sequential elements (not shown) in the integrated circuit device 100. For example, non-scannable elements include B latches that are not transparent during a scan load. The scan control unit 135 asserts SS and CG during the 0br cycle. Non-scannable sequential elements use clock control logic (not shown) that generates a pulse when SS and CG are both asserted. Scannable sequential elements, such as the flip flops 105, 110 do not update during the 0br cycle because the logic 210, 250 both use "CG&~SS" as a logic condition for enabling the flip flops 105, 110 (at the AND gates 228, 230, and 262). In the MuxD scan clock logic 210, the output of AND gate 216 is de-asserted because SSEAsync is de-asserted, and the outputs of AND gates 228 and 236 are de-asserted because SS is asserted. In the LSSD scan clock logic 250, the output of the AND gate 262 is de-asserted because SS is asserted. The particular use of the 0br cycle for non-scannable elements is outside the scope of the present application, but is discussed in the context of the logic 210, 250 to demonstrate that the scannable MuxD and LSSD flip flops 105, 110 are not updated.

Region 325 represents a capture time period. CG is asserted and SS is de-asserted to assert the outputs of the AND gates 230 and 236 in the MuxD scan clock logic 210 and the AND gate 262 in the LSSD scan clock logic 250. Because the PCLK signal is present on the CCLK network, a burst of clock cycles in the MuxD_CLK and LSSD_CLK signals selectively enabled by the de-glitching latches 240, 268. The number of capture pulses is dependent on the length of the CG pulse. The AND gate 220 receives CG1 and SS0. When both CG and SS transition, the transition in CG is seen first, as there is one less pipeline stage. Thus, when CG1 is asserted and SS0 is asserted, the output of the AND gate 220 is asserted and recorded by the flip flop 218. When SS0 is de-asserted, the output of the flip flop 218 is still asserted for one cycle. This condition asserts the output of the AND gate 228, resulting in an additional pulse in the MuxD_CLK burst. This additional clock pulse is referred to as a "launch on shift." Launch on shift is used to generate transitions out of the MuxD flip flops 105 for the purpose of testing the logic downstream of those flip flops 105. Such transitions can also be created by setting a desired value on the functional D input of a flip flop 105, but it is easier for the automated tester to launch on shift by launching from the scan input which is directly connected to the previous scan flip flop 105 in the scan chain. The capture pulses record the results of the scan test so that they may be read on the SDO signal line by the tester.

Region 330 represents a test update phase, where the integrated circuit device 100 is prepared for the next test pattern in the scan test. The SSED signal is asserted to transition from PLCK to SC2r as the clock source for the CCLK network.

Region 335 represents the first shift for loading the next test pattern. The SSEAsync signal is asserted to enable the scan shift mode, as described above for region 305. The scan clock signals MuxD_CLK, SC1m, and SC2m are provided to shift in the next test pattern.

Figure 4:
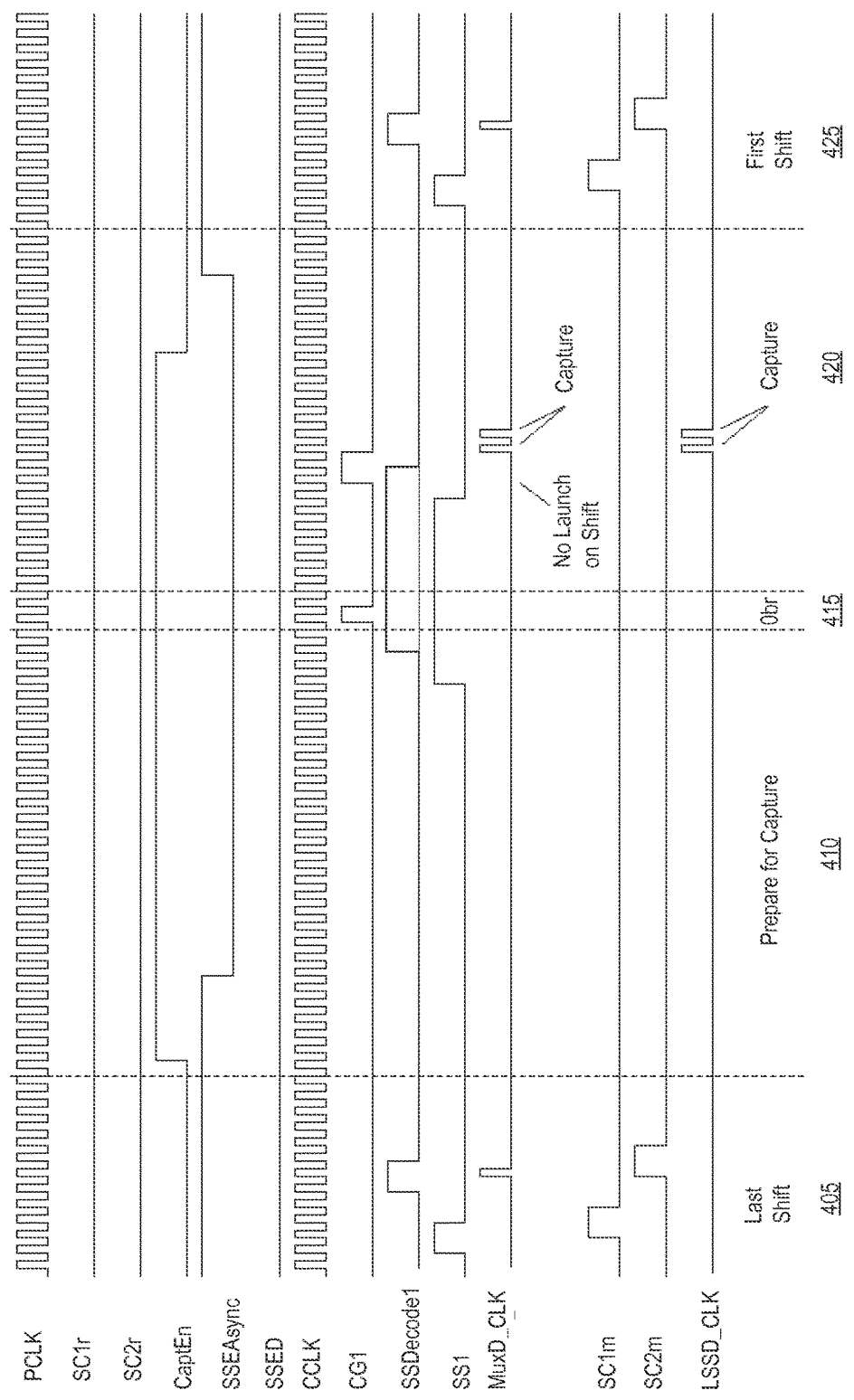
FIG. 4 is a timing diagram illustrating the operation of the circuit of FIG. 1 during an internal scan clocking mode.

Turning now to FIG. 4, a timing diagram 400 illustrating the logic signals generated by the scan control unit 135 for internal scan clocking mode is shown, in accordance with some embodiments. Internal scan clocking (ISC) may be used for logic built-in self-test (LBIST) operations or to support scan shift reset (i.e., shifting constant 0 values through all the scan chains in order to reset all the scan flip flops 105, 110). The operation of the scan clock logic 210, 250 in internal scan clocking mode is described in reference to FIGS. 2 and 4.

Internal scan clocking mode is controlled by de-asserting the ExtScanClocking signal. The scan control unit 135 generates internal scan clock signals for controlling the flip flops 105, 110, so the clock distribution trees 202, 204 are not used for distributing them. SSED is de-asserted, so the PCLK signal is distributed on the CCLK network.

Region 405 represents the last shift of a scan shift period where a test pattern is loaded into a scan chain. The scan control unit 135 uses the SS and SSDecode signals to generate the scan clock signals for the flip flops 105, 110. In the MuxD scan clock logic 210, the multiplexer 224 is configured to select the ~SSDecode1 signal, because ExtScanClocking is de-asserted. SS1 is asserted and SSDecode1 is asserted a predetermined time period after SS1 is asserted, such that SS1 and SSDecode1 are non-overlapping. The duty cycle of SS may be controlled depending on the desired shift frequency for a given CCLK frequency. In some embodiments, the delay between the SS and SSDecode signals may be approximately the length of the SS pulse. The MuxD_CLK is triggered by the SSDecode1 signal. SSEAsync is asserted, thereby asserting the output of the OR gate 222. When SSDecode1 is de-asserted, ~SSDecode1 is asserted, so the output of the AND gate 220 is also asserted. The flip flop 218 registers the asserted output of the AND gate 220. The output of the OR gate 214 is asserted by the assertion of the output of the flip flop 218 placing the multiplexer portion 107 in scan mode to select the SDI input. The output of the AND gate 228 is asserted on the rising edge of the SSDecode1 signal, thereby asserting the output of the OR gate 238, resulting in a MuxD_CLK pulse being selectively passed by the de-glitching latch 240 via the AND gate 242.

In the LSSD scan clock logic 250, the de-assertion of the ExtScanClocking signal configures the multiplexers 252, 254 to select the SS0 and SSDecode0 signals, respectively. Because SSEAsync is also asserted, the AND gates 258, 260 enable the SC1m and SC2m scan clock signals to track the SS0 and SSDecode0 signals. In FIG. 4, the SS1 and SSDecode1 signals are shown, so SS1 and SSDecode1 lead SC1m and SC2m by one CCLK cycle. The output of the AND gate 262 is de-asserted because CG0 is de-asserted. The LSSD_CLK signal is not used to load the scan data, as loading is controlled by the SC1m and SC2m signals.

In region 410, the integrated circuit device 100 is prepared for scan test capture. For ease of comparison, the region 310 and 410 are shown having the same approximate lengths. However, because the CCLK network does not transition between PCLK and SC2r, there is no need for a clock tree wakeup interval when internal scan clocking is used. Thus, the time interval for region 410 may be significantly reduced, saving test time. In region 410, the SSEAsync signal is de-asserted and CaptEn is asserted to enable the output circuitry for capturing the result.

In region 415, a "0br" cycle is used to load non-scannable sequential elements (not shown) in the integrated circuit device 100. The scan control unit 135 asserts SS and CG during the 0br cycle. Non-scannable sequential elements use clock control logic (not shown) that generates a pulse when SS and CG are both asserted. Scannable sequential elements, such as the flip flops 105, 110 do not update during the 0br cycle because the logic 210, 250 both use "CG&~SS" as a logic condition for enabling the flip flops 105, 110. In the MuxD scan clock logic 210, the output of AND gate 216 is de-asserted because SSEAsync is de-asserted, and the outputs of AND gates 228 and 236 are de-asserted because SS is asserted. In the LSSD scan clock logic 250, the output of the AND gate 262 is de-asserted because SS is asserted.

Region 420 represents a capture time period. In the example illustrated in FIG. 4, a launch on shift event is not triggered by the MuxD scan clock logic 210. CG is asserted and SS is de-asserted to assert the outputs of the AND gate 228 in the MuxD scan clock logic 210 and the AND gate 262 in the LSSD scan clock logic 250. A burst of clock cycles in the MuxD_CLK and LSSD_CLK signals is received by the flip flops 105, 110 through the de-glitching latches 240, 268. The number of capture pulses is dependent on the length of the CG pulse. In this example, the output of the AND gate 228 in the MuxD scan clock logic 210 is not asserted, because there is a delay between the de-assertion of SS and the assertion of the CG signal. This offset prevents the AND gate 228 from triggering the launch on shift pulse in the MuxD_CLK signal.

Region 425 represents the first shift for loading the next test pattern. The SSEAsync signal is asserted to enable the scan shift mode, as described above for region 405. The scan clock signals MuxD_CLK, SC1m, and SC2m are provided to shift in the next test pattern.

The use of the scan clock logic 210, 250 described above allows MuxD flip flops 105 and LSSD flip flops 110 to be used in the same clock domain, and even in the same scan chain. The same distribution network may be used for the functional clock and one of the external scan clock signal, thereby simplifying the wire routing in the integrated circuit device 100. Note that in FIGS. 3 and 4, the rising edges of the MuxD_CLK and the SC2m signals are aligned. This alignment allows an interface between two different types of flip flops to be present in the same scan chain (e.g., the scan chain 130 of FIG. 1), such that the data from a MuxD flip flop 105 can be shifted into a LSSD flip flop 110, or vice versa.

In some embodiments, at least some of the functionality described above may be implemented by one or more processors executing one or more software programs tangibly stored at a computer readable medium, and whereby the one or more software programs comprise instructions that, when executed, manipulate the one or more processors to perform one or more functions of the processing system described above. Further, in some embodiments, serial data interfaces described above are implemented with one or more integrated circuit (IC) devices (also referred to as integrated circuit chips). Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but are not limited to, optical media (e.g., compact disc (CD), digital versatile disc (DVD), or Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 5:
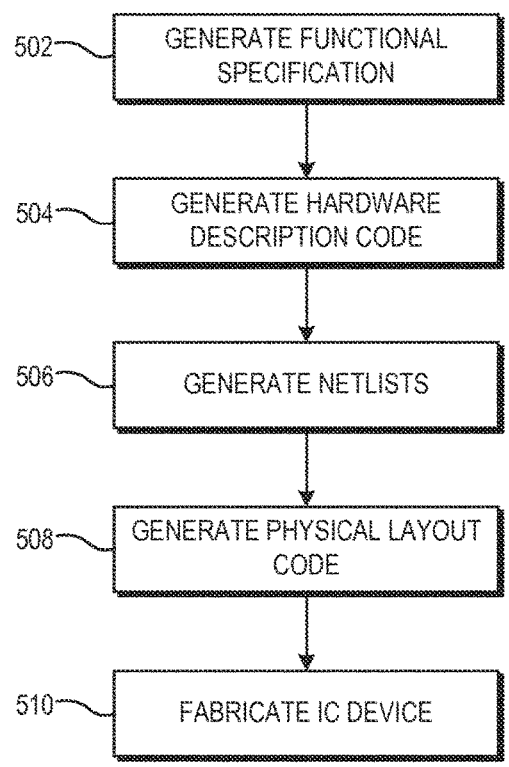
FIG. 5 is a flow diagram illustrating a method for designing and fabricating an integrated circuit device implementing at least a portion of a component of a processor in accordance with some embodiments.

FIG. 5 is a flow diagram illustrating an example method 500 for the design and fabrication of an IC device implementing one or more aspects in accordance with some embodiments. As noted above, the code generated for each of the following processes is stored or otherwise embodied in computer readable storage media for access and use by the corresponding design tool or fabrication tool.

At block 502 a functional specification for the IC device is generated. The functional specification (often referred to as a micro architecture specification (MAS)) may be represented by any of a variety of programming languages or modeling languages, including C, C++, SystemC, Simulink, or MATLAB.

At block 504, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 506 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 508, one or more EDA tools use the netlists produced at block 506 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 510, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

As disclosed herein, in some embodiments, an integrated circuit device includes a plurality of flip flops configured into a scan chain. The plurality of flip flops includes at least flip flop of a first type and at least one flip flop of a second type.

As disclosed herein, in some embodiments, a method includes generating a first scan clock signal for loading scan data into at least one flip flop of a first type, generating a second scan clock signal and a third scan clock signal for loading the scan data into at least one flip flop of a second type, and loading a test pattern into a scan chain defined by the at least flip flop of the first type and the at least one flip flop of the second type responsive to the first, second, and third scan clock signals.

As disclosed herein, in some embodiments a non-transitory computer readable medium stores code to adapt at least one computer system to perform a portion of a process to fabricate at least part of an integrated circuit device. The integrated circuit device includes a plurality of flip flops configured into a scan chain. The plurality of flip flops includes at least flip flop of a first type and at least one flip flop of a second type.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit device, comprising:
 a plurality of flip flops configured into a scan chain, wherein the plurality of flip flops includes at least one flip flop of a first type and at least one flip flop of a second type, and further wherein a common clock signal is used to generate a first scan clock signal and a second scan clock signal for aligning the at least one flip flop of the first type and the at least one flip flop of the second type in a same time domain during scan shifting, and wherein the at least one flip flop of the second type further receives a third scan clock signal.

2. The device of claim 1, wherein the first type comprises a multiplexer data flip flop and the second type comprises a level-sensitive scan design flip-flop.

3. The device of claim 2, further comprising:
 logic to provide the first scan clock signal to the multiplexer data flip flop for loading scan data and second and third scan clock signals to the level-sensitive scan design flip-flop for loading the scan data, wherein the second and third scan clock signals are non-overlapping, and further wherein the first and third scan clock signals are generated from the common clock signal.

4. The device of claim 3, wherein the logic is to generate the second scan clock signal from a first external scan clock signal and generate the first and third scan clock signals from a second external scan clock signal, wherein the first and second external scan clock signals are received by the integrated circuit device.

5. The device of claim 4, further comprising:
 at least one clock distribution tree to distribute the common clock signal and the first external scan clock signal; and
 a multiplexer coupled to the clock distribution tree and to select one of a functional clock signal for operating the plurality of flip flops while not in a scan mode or the second external scan clock signal as the common clock signal while in the scan mode.

6. The device of claim 5, further comprising:
 a scan control unit to configure the multiplexer to select the second external scan clock signal and generate a scan shift enable signal,
 wherein the logic further comprises:
  a latch coupled to the clock distribution tree to receive the common clock signal and coupled to a first clock terminal of the multiplexer data flip flop, wherein latch is to selectively pass the second external scan clock signal to the first clock terminal to generate the first scan clock signal responsive to the scan shift enable signal;
  a first logic gate coupled to a first scan clock terminal of the level-sensitive scan design flip flop and coupled to receive the first external scan clock signal and generate the first scan clock signal responsive to the scan shift enable signal; and
  a second logic gate coupled to the clock distribution tree and a second scan clock terminal of the level-sensitive scan design flip flop and coupled to receive the second external scan clock signal and generate the third scan clock signal responsive to the scan shift enable signal.

7. The device of claim 4, wherein a rising edge of the first scan clock signal is aligned with a rising edge of the third scan clock signal.

8. The device of claim 2, further comprising:
 a scan control unit to generate first and second scan shift signals;
 first logic to generate a first internal scan clock signal for the level-sensitive scan design flip-flop based on the first scan shift signal and generate a second internal scan clock signal for the level-sensitive scan design flip-flop based on the second scan shift signal; and
 second logic to generate a third internal scan clock signal for the level-sensitive scan design flip-flop based on the second scan shift signal.

9. The device of claim 8, wherein a rising edge of the second internal scan clock signal is aligned with a rising edge of the third internal scan clock signal.

10. The device of claim 8, further comprising:
a delay network to generate the second scan shift signal based on the first scan shift signal, wherein the first and second scan shift signals are non-overlapping.

11. The device of claim 2, further comprising:
a scan control unit to generate a scan shift signal and a clock gater signal;
first logic to selectively couple a functional clock signal for clocking the multiplexer-data flip flop while not in a scan mode to a first clock terminal of the multiplexer data flip flop responsive to the scan shift signal and the clock gater signal to generate at least one capture pulse at the first clock terminal; and
second logic to selectively couple the functional clock signal to a second clock terminal of the level-sensitive scan design flip flop responsive to the scan shift signal and the clock gater signal to generate at least one capture pulse at the second clock terminal.

12. The device of claim 11, wherein the first logic is to selectively couple the functional clock signal to the first clock terminal responsive to the scan shift and clock gater signals to generate at least one additional pulse preceding the capture pulse.

13. The device of claim 11, wherein:
the first logic further comprises:
a first latch to selectively couple the functional clock signal to the first clock terminal; and
a first logic gate to enable the first latch responsive to a first logic state of the scan shift signal and a second logic state of the clock gater signal; and
the second logic further comprises:
a second latch to selectively couple the functional clock signal to the second clock terminal; and
a second logic gate to enable the second latch responsive to the first logic state of the scan shift signal and the second logic state of the clock gater signal.

14. A method, comprising:
generating, based on a common clock signal, a first scan clock signal for loading scan data into at least one flip flop of a first type; and
generating a second scan clock signal and a third scan clock signal for loading the scan data into at least one flip flop of a second type, wherein at least one of the second and third scan clock signals is generated based on the common clock signal; and
loading a test pattern into a scan chain defined by the at least flip flop of the first type and the at least one flip flop of the second type responsive to the first, second, and third scan clock signals, wherein the at least one flip flop of the second type receives both the second scan clock signal and the third scan clock signal during scan shifting.

15. The method of claim 14, wherein the first type comprises a multiplexer data flip flop and the second type comprises a level-sensitive scan design flip-flop.

16. The method of claim 15, further comprising:
receiving first and second external scan clock signals;
generating the second scan clock signal from the first external scan clock signal; and
generating the first and third scan clock signals from the second external scan clock signal, wherein the first and third scan clock signals have rising edges aligned with one another.

17. The method of claim 16, further comprising:
configuring a multiplexer to distribute one of a functional clock signal for operating the multiplexer data flip flop while not in a scan mode and the level-sensitive design flip flop or the second external scan clock signal on a common clock signal distribution network.

18. The method of claim 15, further comprising:
generating first and second scan shift signals, wherein the first and second scan clock signals are non-overlapping;
generating the second scan clock signal based on the first scan shift signal; and
generating the first scan clock signal based on the second scan shift signal.

19. The method of claim 18, further comprising delaying the first scan shift signal to generate the second scan shift signal.

20. The method of claim 15, further comprising:
generating a scan shift signal and a clock gater signal;
selectively coupling a functional clock signal for operating the multiplexer data flip flop while not in a scan mode to a first clock terminal of the multiplexer data flip flop responsive to the scan shift signal and the clock gater signal to generate at least one capture pulse at the first clock terminal; and
selectively coupling the functional clock signal to a second clock terminal of the level-sensitive scan design flip flop responsive to the scan shift signal and the clock gater signal to generate at least one capture pulse at the second clock terminal.

21. The method of claim 20, further comprising:
selectively coupling the functional clock signal to the first clock terminal responsive to the scan shift and clock gater signals to generate at least one additional pulse preceding the capture pulse.

22. A non-transitory computer readable medium storing code to adapt at least one computer system to perform a portion of a process to fabricate at least part of an integrated circuit device, the integrated circuit device comprising:
a plurality of flip flops configured into a scan chain, wherein the plurality of flip flops includes at least one flip flop of a first type and at least one flip flop of a second type, and further wherein a common clock signal is used to generate a first scan clock signal and a second scan clock signal for aligning the at least one flip flop of the first type and the at least one flip flop of the second type in a same time domain during scan shifting, and wherein the at least one flip flop of the second type further receives a third scan clock signal.

* * * * *